US012765429B2

(12) United States Patent
Katkar et al.

(10) Patent No.: US 12,765,429 B2
(45) **Date of Patent: *Oct. 13, 2026**

(54) ELECTRICAL REDUNDANCY FOR BONDED STRUCTURES

(71) Applicant: ADEIA SEMICONDUCTOR BONDING TECHNOLOGIES INC., San Jose, CA (US)

(72) Inventors: Rajesh Katkar, Milpitas, CA (US); Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 110 days.

This patent is subject to a terminal disclaimer.

(21) Appl. No.: 19/005,047

(22) Filed: Dec. 30, 2024

(65) Prior Publication Data

US 2025/0266400 A1 Aug. 21, 2025

Related U.S. Application Data

(63) Continuation of application No. 18/535,375, filed on Dec. 11, 2023, now Pat. No. 12,218,107, which is a (Continued)

(51) Int. Cl.
*H10W 90/00* (2026.01)
*H10W 72/00* (2026.01)
(Continued)

(52) U.S. Cl.
CPC ....... *H10W 90/00* (2026.01); *H10W 72/0198* (2026.01); *H10W 72/30* (2026.01); *H10W 72/90* (2026.01)

(58) Field of Classification Search
None
See application file for complete search history.

(56) References Cited

U.S. PATENT DOCUMENTS

| | | | |
|---|---|---|---|
| 6,255,899 | B1 | 7/2001 | Bertin et al. |
| 7,385,283 | B2 | 6/2008 | Wu et al. |

(Continued)

FOREIGN PATENT DOCUMENTS

| | | | |
|---|---|---|---|
| KR | 20190059857 | A | 5/2019 |
| KR | 20190122794 | A | 10/2019 |
| KR | 10-2020-0083398 | | 7/2020 |

OTHER PUBLICATIONS

Bush, Steve, "Electronica: Automotive power modules from on Semi," ElectronicsWeekly.com, indicating AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023) ("Bush article").

(Continued)

*Primary Examiner* — Nicholas J Tobergte
(74) *Attorney, Agent, or Firm* — Knobbe, Martens, Olson & Bear, LLP

(57) ABSTRACT

An element that is configured to bond to another element is disclosed. A first element that can include a first plurality of contact pads on a first surface. The first plurality of contact pads includes a first contact pad and a second contact pad that are spaced apart from one another. The first and second contact pads are electrically connected to one another for redundancy. The first element can be prepared for direct bonding. The first element can be bonded to a second element to form a bonded structure. The second element has a second plurality of contact pads on a second surface. At least one of the second plurality of contact pads is bonded and electrically connected to at least one of the first plurality of contact pads.

31 Claims, 5 Drawing Sheets

Related U.S. Application Data continuation of application No. 17/129,632, filed on Dec. 21, 2020, now Pat. No. 11,842,894.

(60) Provisional application No. 62/953,046, filed on Dec. 23, 2019.

(51) Int. Cl.
*H10W 72/30* (2026.01)
*H10W 72/90* (2026.01)

(56) References Cited

U.S. PATENT DOCUMENTS

| | | | | |
|---|---|---|---|---|
| 9,064,862 | B2 | 6/2015 | Hwang et al. | |
| 9,106,229 | B1 | 8/2015 | Hutton et al. | |
| 9,401,312 | B1 | 7/2016 | Kannan et al. | |
| 9,536,848 | B2 | 1/2017 | England et al. | |
| 9,748,206 | B1 | 8/2017 | Huang et al. | |
| 10,797,037 | B1 | 10/2020 | Lin | |
| 10,804,255 | B1 | 10/2020 | Agarwal et al. | |
| 11,127,738 | B2 | 9/2021 | DeLaCruz et al. | |
| 11,842,894 | B2 * | 12/2023 | Katkar | H10W 90/00 |
| 12,046,583 | B2 * | 7/2024 | Katkar | H10W 90/00 |
| 12,218,107 | B2 * | 2/2025 | Katkar | H10W 90/00 |
| 12,308,332 | B2 | 5/2025 | DeLaCruz et al. | |
| 12,341,114 | B2 | 6/2025 | Dogiamis et al. | |
| 12,543,577 | B2 | 2/2026 | Haba et al. | |
| 2005/0184398 | A1 | 8/2005 | Zhou et al. | |
| 2006/0267221 | A1 | 11/2006 | Allen | |
| 2011/0050320 | A1 | 3/2011 | Gillingham | |
| 2011/0292708 | A1 | 12/2011 | Kang et al. | |
| 2011/0316572 | A1 | 12/2011 | Rahman | |
| 2013/0214410 | A1 | 8/2013 | Khan et al. | |
| 2014/0210097 | A1 | 7/2014 | Chen et al. | |
| 2014/0293705 | A1 | 10/2014 | Gillingham | |
| 2015/0085195 | A1 | 3/2015 | Pereira et al. | |
| 2015/0206824 | A1 | 7/2015 | Ramachandra et al. | |
| 2015/0243611 | A1 | 8/2015 | Liu et al. | |
| 2015/0333056 | A1 | 11/2015 | Du et al. | |
| 2015/0346279 | A1 | 12/2015 | Douskey et al. | |
| 2015/0380341 | A1 | 12/2015 | Chiou et al. | |
| 2016/0005716 | A1 | 1/2016 | Yu et al. | |
| 2016/0118095 | A1 | 4/2016 | Pelley et al. | |
| 2016/0181228 | A1 | 6/2016 | Higuchi et al. | |
| 2017/0069593 | A1 | 3/2017 | Chou et al. | |
| 2017/0125383 | A1 | 5/2017 | Liu | |
| 2017/0250160 | A1 | 8/2017 | Wu et al. | |
| 2018/0012868 | A1 | 1/2018 | Wu et al. | |
| 2018/0040547 | A1 | 2/2018 | Zuo et al. | |
| 2018/0323952 | A1 | 11/2018 | Chang et al. | |
| 2019/0013295 | A1 | 1/2019 | Wu et al. | |
| 2019/0066571 | A1 | 2/2019 | Goward | |
| 2019/0157333 | A1 | 5/2019 | Tsai et al. | |
| 2019/0253056 | A1 | 8/2019 | Lin et al. | |
| 2019/0355706 | A1 | 11/2019 | Enquist et al. | |
| 2019/0385982 | A1 | 12/2019 | Lee et al. | |
| 2020/0035643 | A1 | 1/2020 | Hirata et al. | |
| 2020/0286875 | A1 | 9/2020 | Nishida et al. | |
| 2020/0294918 | A1 | 9/2020 | Nishida et al. | |
| 2020/0395339 | A1 | 12/2020 | Chen et al. | |
| 2020/0402959 | A1 | 12/2020 | Eom et al. | |
| 2021/0020601 | A1 | 1/2021 | Chen et al. | |
| 2021/0035943 | A1 | 2/2021 | Ramm | |
| 2021/0082865 | A1 | 3/2021 | Baraskar et al. | |
| 2021/0143921 | A1 | 5/2021 | Nasrullah et al. | |
| 2021/0384133 | A1 | 12/2021 | Ong et al. | |
| 2022/0020741 | A1 | 1/2022 | DeLaCruz et al. | |
| 2023/0075833 | A1 | 3/2023 | Choi et al. | |
| 2025/0004197 | A1 | 1/2025 | Haba et al. | |
| 2025/0006632 | A1 | 1/2025 | Chang et al. | |
| 2025/0006642 | A1 | 1/2025 | Haba et al. | |
| 2025/0006674 | A1 | 1/2025 | Uzoh et al. | |
| 2025/0006679 | A1 | 1/2025 | Theil et al. | |
| 2025/0006689 | A1 | 1/2025 | Uzoh et al. | |
| 2025/0054854 | A1 | 2/2025 | Katkar et al. | |
| 2025/0079364 | A1 | 3/2025 | Uzoh et al. | |
| 2025/0096191 | A1 | 3/2025 | Gao et al. | |
| 2025/0112123 | A1 | 4/2025 | Katkar et al. | |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Peters, Laura, "The Path to Known Good Interconnects," semiengineering.com/the-path-to-known-good-interconnects, Jan. 19, 2023, 13 pages (printed Jan. 24, 2023).

Sohail O., "Sony has released the Smartphone Industry's first 48MP Sensor that goes beyond recording 4K Footage at 60FPS". Release of IMX586; Jul. 23, 2018, downloaded from https://wccftech.com/sony-releases-48mp-smartphone-sensor/ on May 3, 2024, 4 pages.

International Search Report and Written Opinion mailed Apr. 22, 2021, International Application No. PCT/US2020/066467, 12 pages.

Korean Notice of Allowance, re KR Application No. 10-2022-7025451, dated Nov. 20, 2025.

Lee, Hsien-Hsin, "Test Challenges for 3D Integrated Circuits," IEEE Design & Test of Computers, Sep./Oct. 2009.

* cited by examiner

ELECTRICAL REDUNDANCY FOR BONDED STRUCTURES

REFERENCE TO RELATED APPLICATIONS

This application is a continuation of U.S. application Ser. No. 18/535,375, filed Dec. 11, 2023, which is a continuation of U.S. application Ser. No. 17/129,632, filed Dec. 21, 2020, issued Dec. 12, 2023 as U.S. Pat. No. 11,842,894, and claims the priority benefit of U.S. Provisional Application No. 62/953,046, filed Dec. 23, 2019, the disclosures of which are hereby incorporated by reference herein in their entireties.

BACKGROUND

Field of the Invention

The field relates to electrical redundancy for bonded structures and, in particular, for structures that are directly bonded without an adhesive.

Description of the Related Art

Multiple semiconductor elements (such as integrated device dies) may be stacked on top of one another in various applications, such as high bandwidth memory (HBM) devices or other devices that utilize vertical integration. The stacked elements can electrically communicate with one another through arrays of contact pads. It can be important to ensure that the electrical connections between contact pads on two stacked elements are reliable.

BRIEF DESCRIPTION OF THE DRAWINGS

Specific implementations will now be described with reference to the following drawings, which are provided by way of example, and not limitation.

DETAILED DESCRIPTION

Figure 1A:
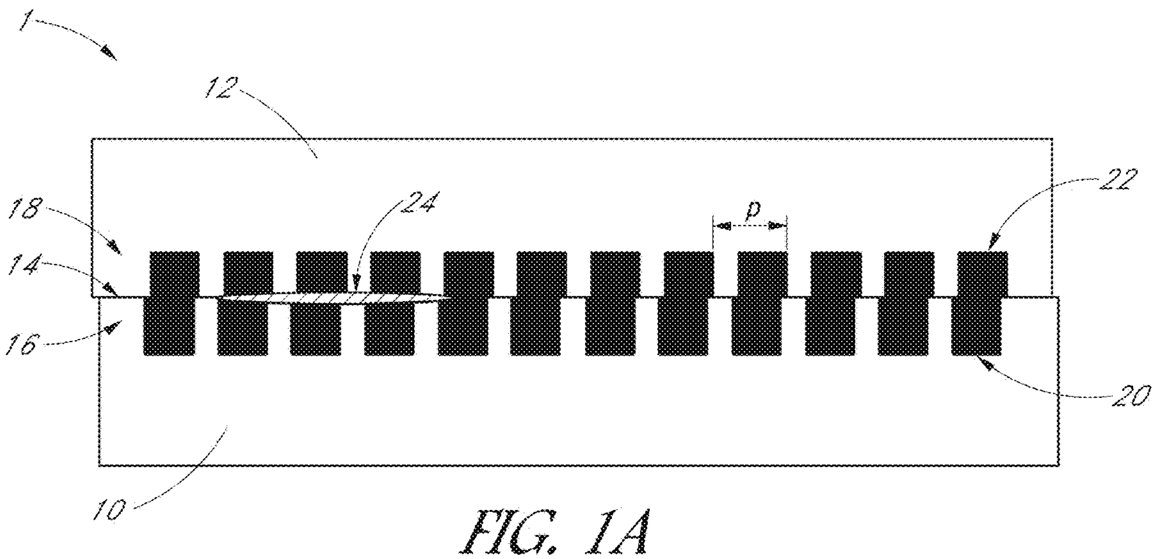
FIG. 1A is a schematic side sectional view of a bonded structure comprising a first element and a second element stacked on and bonded to the first element along a bonding interface.

Two or more semiconductor elements (such as integrated device dies) may be stacked on or bonded to one another to form a bonded structure. Conductive contact pads of one element may be electrically connected to corresponding conductive contact pads of another element. Any suitable number of elements can be stacked in the bonded structure. In some embodiments, the elements are directly bonded to one another without an adhesive. In other embodiments, the elements may be bonded with a conductive adhesive, such as solder, etc.

In various embodiments, a dielectric field region of a first element (e.g., a first semiconductor device die with active circuitry) can be directly bonded (e.g., using dielectric-to-dielectric bonding techniques, such as the ZiBond® technique used by Xperi Corporation of San Jose, California) to a corresponding dielectric field region of a second element (e.g., a second semiconductor device die with active circuitry) without an adhesive. For example, dielectric-to-dielectric bonds may be formed without an adhesive using the direct bonding techniques disclosed at least in U.S. Pat. Nos. 9,391,143 and 10,434,749, the entire contents of each of which are incorporated by reference herein in their entirety and for all purposes. Dielectrics that can be treated and activated for direct bonding include, for example, inorganic dielectrics, particularly those including silicon, such as silicon oxide (SiO), silicon nitride (SiN), silicon carbide (SiC), silicon oxynitride (SiON), silicon oxycarbide (SiOC), silicon carbonitride (SiCN), etc.

In various embodiments, the hybrid direct bonds can be formed without an intervening adhesive. For example, dielectric bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two dielectric materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can be directly bonded to corresponding conductive contact pads of the second element. For example, a hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric bonds can be formed using the direct hybrid bonding techniques disclosed at least in U.S. Pat. Nos. 9,716,033 and 9,852,988, the entire contents of each of which are incorporated by reference herein in their entirety and for all purposes.

For example, dielectric bonding surfaces can be prepared and directly bonded to one another without an intervening adhesive. Conductive contact pads (which may be surrounded by nonconductive dielectric field regions) may also directly bond to one another without an intervening adhesive. In some embodiments, the respective contact pads can be recessed below the dielectric field regions, for example, recessed by less than 20 nm, less than 15 nm, or less than 10 nm, for example, recessed in a range of 2 nm to 20 nm, or in a range of 4 nm to 10 nm. With such slight recessing or corresponding protrusion, the contacts pads are still considered to be at the relevant element surface within the meaning of the present application. The dielectric field regions can be initially directly bonded to one another without an adhesive and without external pressure at room temperature in some embodiments and, subsequently, the bonded structure can be annealed. Upon annealing, the contact pads can expand and contact one another to form a metal-to-metal direct bond. Beneficially, the use of the hybrid bonding techniques known by the trade name Direct Bond Interconnect, or DBI®, can enable fine pixel pitches as explained above and/or high density of pads connected across the direct bond interface (e.g., small or fine pitches for regular arrays). In some embodiments, the pitch of the bonding pads may be less than 40 microns or less than 10 microns or even less than 2 microns. For some applications the ratio of the pitch of the bonding pads (a size of a pad plus a spacing between the pad to an adjacent pad) to one of the dimensions of the bonding pad (the size of the pad) is less than 5, or less than 3 and sometimes desirably less than 2. In various embodiments, the contact pads can comprise copper, although other metals may be suitable. In some embodiments, bonding pads can have two or more different pitches. For example, a pitch of the bonding pads may be about 40 microns in one area of the first and/or second element, and another pitch of the bonding pads may be 10 microns in another area of the first and/or second element.

In various embodiments, the contact pads can be formed in respective first and second arrays of pads on the first and second elements. If any debris or surface contaminant is present at the surface of the first or second elements, voids may be created at the bond interface, or debris may intervene between opposing contact pads. In addition, reactant byproducts generated during bonding and annealing, e.g. hydrogen and water vapor, may also form voids at the bond interface. These voids may effectively inhibit the joining of particular contact pads in the vicinity, creating openings or other failures in the bond. For example, any void larger than the pad diameter (or pitch) can potentially create an opening and hybrid bond failure.

Beneficially, various embodiments disclosed herein can provide electrical redundancy such that redundant contact pads (e.g., a pair of electrically redundant pads) are laterally separated by a spacing large enough to overcome typical void dimensions. In such embodiments, electrical connection can be made between two directly bonded elements even if one pair of corresponding contact pads are not directly connected due to a void at the bond interface, because a redundant pair for the same desired electrical connection are directly connected. The disclosed embodiments can accordingly improve device yield. In some cases, speed may be affected if, for example, the void occurs for a pad with a short connection. In various embodiments, redundancy may not be implemented for all the contact pads of an element, and instead may be implemented for only a subset of the connections desired across the bond interface. In other embodiments, however, each desired connection across the bond interface may be provided with one or more redundant contact pads on both sides of the bond interface (redundant bond pad pairs). In some embodiments, the electrical redundancy may be provided for only signal pads, and may not be provided for power and ground pads. In other embodiments, electrical redundancy may also be provided for power and/or ground pads.

As explained herein, two or more pads for the same element (the same side of a bond interface) can be provided with pad redundancy by electrically shorting the two or more pads together. In various embodiments, the pads can be shorted together by a wire or trace that does not include any active circuitry or switches. The two or more pads can be spaced or offset for redundancy by a spacing in a range of 1 micron to 10 microns for pads near one another, or by a spacing in a range of 50 microns to 100 microns for pads in different regions of the bonded structure. In some arrangements, pads offset by large dimensions, when implemented due to voids, may affect speed due to increases in impedance with lengthened current paths; however, such redundancy improves the probability of making an adequate electrical contact even if the openings or voids may not be completely eliminated. In large devices, the electrical redundancy may result in lateral trace routing designs more complicated than in other structures.

In some embodiments, the element can comprise active circuitry, a switch, and/or an electronic fuse that is coupled to the trace. The active circuitry, switch or electronic fuse can selectively connect a preferred electrical path. Some logic may also be implemented in the first or second element such that when one or more contact pads in the first preferred electrical path is detected to have a faulty connection, the switch or electronic fuse may be activated to disconnect the preferred path and make the electrical connection for another electrical path utilizing redundant pads.

FIG. 1A is a schematic side sectional view of a bonded structure 1 comprising a first element 10 (e.g., a first semiconductor device die) and a second element 12 (e.g., a second semiconductor device die) stacked on and bonded to the first element 10 along a bonding interface 14. In the illustrated embodiment, the first and second elements 10, 12 are directly bonded without an adhesive. For example, corresponding dielectric field regions (e.g., a first dielectric field region 16 and a second dielectric field region 18) and corresponding contact pads (e.g., first contact pads 20 and second contact pads 22) may be directly bonded without an intervening adhesive in a direct hybrid bond arrangement. As explained above, if one or both of the first and second elements 10, 12 is contaminated or includes debris on the bonding surface(s), then one or more faults 24 may be present so as to impair direct hybrid bonding between the first and second elements at those locations. The fault(s) can include a void or an opening, and/or a debris. If the fault(s) 24 are at or near contact pads, then the electrical connection between two opposing or corresponding contact pads 20, 22 may be ineffective.

Figure 1B:
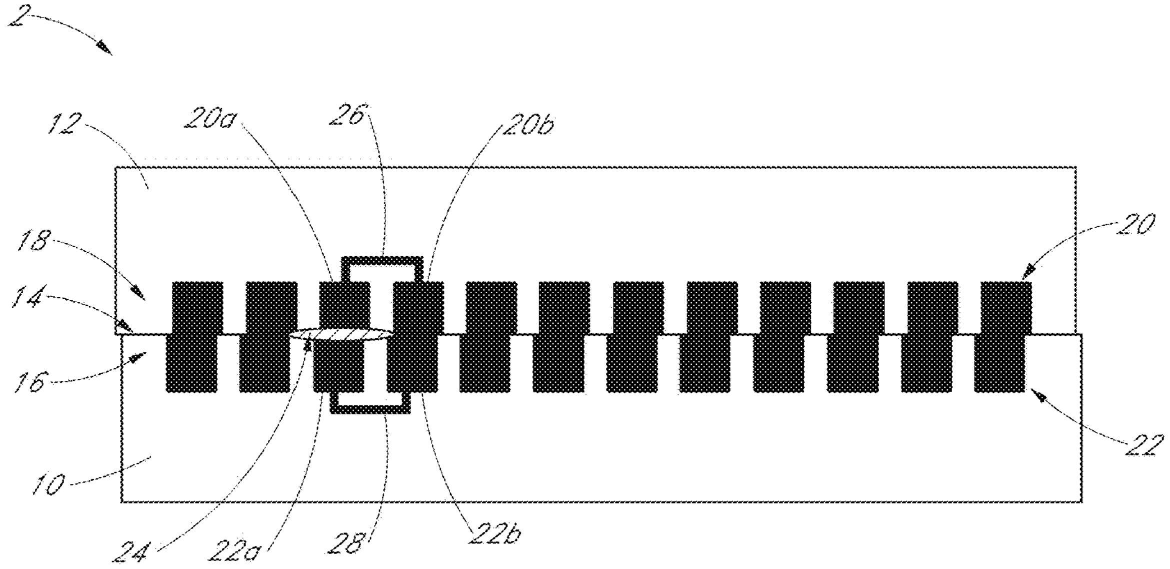
FIG. 1B is a schematic side sectional view of a bonded structure comprising a first element and a second element stacked on and bonded to the first element along a bonding interface, according to one embodiment.
Figure 1C:
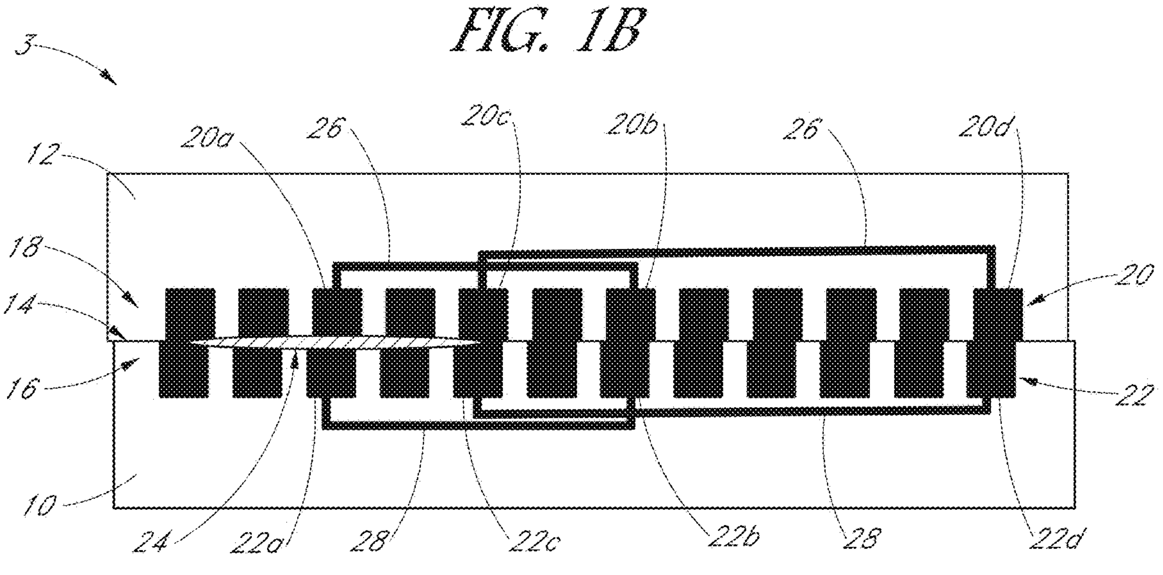
FIG. 1C is a schematic side sectional view of a bonded structure comprising a first element and a second element stacked on and bonded to the first element along a bonding interface, according to another embodiment.

FIG. 1B is a schematic side sectional view of a bonded structure 2 comprising a first element 10 (e.g., a first semiconductor device die) and a second element 12 (e.g., a second semiconductor device die) stacked on and bonded to the first element 10 along a bonding interface 14. FIG. 1C is a schematic side sectional view of a bonded structure 3 comprising a first element 10 (e.g., a first semiconductor device die) and a second element 12 (e.g., a second semiconductor device die) stacked on and bonded to the first element 10 along a bonding interface 14. As in FIG. 1A, in FIGS. 1B and 1C, corresponding dielectric field regions (e.g., a first dielectric field region 16 and a second dielectric field region 18) and corresponding contact pads (e.g., first contact pads 20 and second contact pads 22) may be directly bonded without an intervening adhesive in direct hybrid bonding arrangements.

In FIGS. 1B and 1C, in the event that one or more contact pads (e.g., the first contact pads 20) may not electrically and/or directly contact one or more corresponding pads (e.g., the second contact pads 22) on opposite dies or semiconductor elements ("an unconnected pad 20*a*, 22*a*," see the first pad in FIGS. 1B and 1C) due to, for example, the fault(s) 24, one or more conductive lines, shown in the form of traces 26, 28, can connect the unconnected pad 20*a*, 22*a* to another contact pad 20*b*, 22*b* to provide electrical redundancy. Although connections from the pads to internal circuitry are not shown, the skilled artisan will readily appreciate such connections exist, and that the traces 26, 28 effectively connect that internal circuitry to both pads 20*a*, 20*b* or 22*a*, 22*b*. In some embodiments, internal circuitry 30 (see FIG. 1D) including a switch or an electronic fuse may also be used to allow either or both of pad pairs 20*a*, 22*a* and 20*b*, 22*b* to be in the electrical path connecting those contact pads to internal electrical circuitry in the bonded structure 2. The internal circuitry 30 (see FIG. 1D) can be connected via conductive lines such as the traces 26 and/or 28 of first element or second element. The internal circuitry may also include some logic component to select one pad pair (e.g., the pads 20*a*, 22*a*) over other (e.g., the pads 20*b*, 22*b*). The trace(s) 26, 28 can be provided in both the first and second elements 10, 12, as shown in FIGS. 1B and 1C. In other embodiments, the trace(s) 26, 28 can be provided in only one of the first and second elements 10, 12. The trace(s) 26, 28 can serve to electrically short a first unconnected contact pad 20*a*, 20*c*, 22*a*, 22*c* to a second functional and connected contact pad 20*b*, 20*d*, 22*b*, 22*d* to provide electrical redundancy. Thus, even though the first pad 20*a* may not be electrically connected to a corresponding pad 22*a* on the second element 12 (or vice versa), the second pad 20*b* can provide the connection so that the bonded structure 2, 3 maintains all electrical connections. In some embodiments, the trace(s) 26. 28 connecting redundant pads lack switches or other circuitry that may otherwise add to complexity and impedance, and may be implemented entirely within the back-end-of-line (BEOL). FIGS. 1B and 1C show redundant for unconnected or poorly connected pad pairs 20*a*/22*a*, 20*c*/22*c* for purposes of illustration of the advantage of such redundancy. Of course, the skilled artisan will understand that the actual voids resulting in the unconnected or poorly connected pads do not exist at the time of die design, and may not occur at all after bonding, and the redundancy is best viewed as a prophylactic measure. Provision of the redundant connections greatly improves chances of successfully completing the desired electrical connections, regardless of whether such voids actually form in the course of direct hybrid bonding.

In FIG. 1B, the trace(s) 26, 28 can connect and electrically short two pads 20*a*, 20*b*/22*a*, 22*b* within each element that are near one another. In the illustrated embodiment, the trace(s) can connect two adjacent pads. In FIG. 1C, the trace(s) 26, 28 can connect and short two pads 20*a*, 20*b*/20*c*, 20*d*/22*a*, 22*b*/22*c*, 22*d* that are relatively far apart from one another, e.g., in different regions of the bonded structure. Providing an increased spacing between the first and second contact pads can beneficially improve the probability of adequate electrical redundancy, since the increased spacing between shorted pads may be able to effectively position the second connected contact pad sufficiently far away from the fault(s) and the first unconnected contact pad. Therefore, a bonded structure with a trace(s) that connects pads that are relatively far apart can be particularly beneficial when the bonded structure has a relatively large fault(s).

In some embodiments, in which pads 20, 22 form part of a regular array or distribution of contact pads, the first and second pads 20*a*, 20*b*/22*a*, 22*b* can be spaced apart by a spacing that is at least a pitch p of the contact pads 20, 22, at least twice the pitch p of the contact pads 20, 22, at least three times the pitch p, or at least five times the pitch p. For purposes of this comparison, the pitch p can be associated with a minimum pitch of pads 20, 22 along the first or second elements 10, 12, in cases where the shorted pads 20, 22 may be parts of pad groups with different pitches. In some embodiments, the first and second pads 20*a*, 20*b*/22*a*, 22*b* can be spaced apart by a spacing that is in a range of two to 1000 times the minimum pitch p of the pads 20, 22, in a range of two to 500 times the pitch p, or in a range of two to fifty times the pitch p. In some embodiments, the first and second pads 20*a*, 20*b*/22*a*, 22*b* can be spaced apart such that at least one contact pad is disposed between the first and second pads 20*a*, 20*b*/22*a*, 22*b*. For example, the first and second pads 20*a*, 20*b*/22*a*, 22*b* can be spaced apart such that at least two contact pads, at least three contact pads, or at least four contact pads are disposed between the first and second pads. However, the skilled artisan will appreciate that even adjacent pads can be adequately spaced for achieving the desired redundancy, as shown in FIG. 1B, and that not all dies have regular bond pad patterns (i.e., not all semiconductor elements have identifiable pitches). In various embodiments, the first and second contact pads 20*a*, 20*b*/22*a*, 22*b* can be spaced apart by a spacing in a range of 2 microns to 100 microns, in a range of 10 microns to 100 microns, in a range of 10 microns to 5 mm, in a range of 10 microns to 1000 microns, in a range of 50 microns to 5 mm, in a range of 50 microns to 1000 microns, in a range of 50 micron to 500 microns, in a range of 100 microns to 1000 microns, in a range of 100 microns to 500 microns, or in a range of 50 microns to 1500 microns.

Figure 1D:
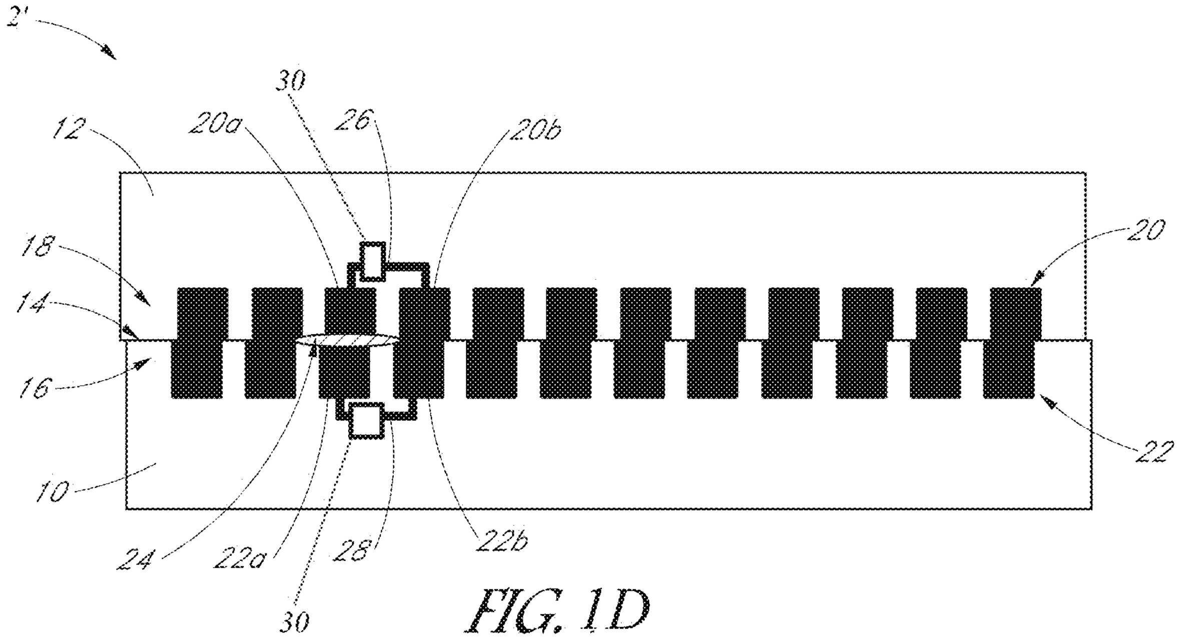
FIG. 1D is a schematic side sectional view of a bonded structure comprising a first element and a second element stacked on and bonded to the first element along a bonding interface, according to another embodiment.

FIG. 1D is a schematic side sectional view of a bonded structure 2' comprising a first element 10 (e.g., a first semiconductor device die) and a second element 12 (e.g., a second semiconductor device die) stacked on and bonded to the first element 10 along a bonding interface 14. The bonded structure 2' illustrated in FIG. 1D is generally similar to the bonded structure 2 illustrated in FIG. 1B. The bonded structure 2' can include internal circuitry 30 that is electrically coupled to the trace(s) 26, 28. The internal circuitry 30 can include a switch or an electronic fuse. In some embodiments, the internal circuitry 30 may be used to allow either or both of pad pairs 20*a*, 22*a* and 20*b*, 22*b* to be in the electrical path to be enabled. The internal circuitry 30 may also include some logic component to select one pad pair (e.g., the pads 20*a*, 22*a*) over other (e.g., the pads 20*b*, 22*b*). While illustrated as controlling conductivity along the traces 26, 28 of both elements 10, 12, the skilled artisan will appreciate that the circuitry 30 can be provided on only one of the elements 10, 12. The internal circuitry 30 may be included in bonded structures that are the same as or general similar to the bonded structure 3 illustrated in FIG. 1C.

FIGS. 2A-2E are schematic top plan views of example bonded structures 4-8. The bonded structures 4-8 can include devices. The devices in FIGS. 2A-2E represent stacked devices such as high bandwidth memory (HBM) devices and other three-dimensional stacked devices. As shown in the top views of FIGS. 2A-2E, the bonded structures 4-8 can each comprise a high density via region or a conductive via region 32 in which conductive vias transfer signals vertically to dies within the stack of semiconductor elements, and peripheral regions 34 where there is room to provide redundant contact pads. It can be important to provide electrical redundancy for pads that are located within the conductive via regions 32. Beneficially, the space provided by the peripheral regions 34 or zones may include empty space that can be used for redundant contact pads.

Figure 2B:
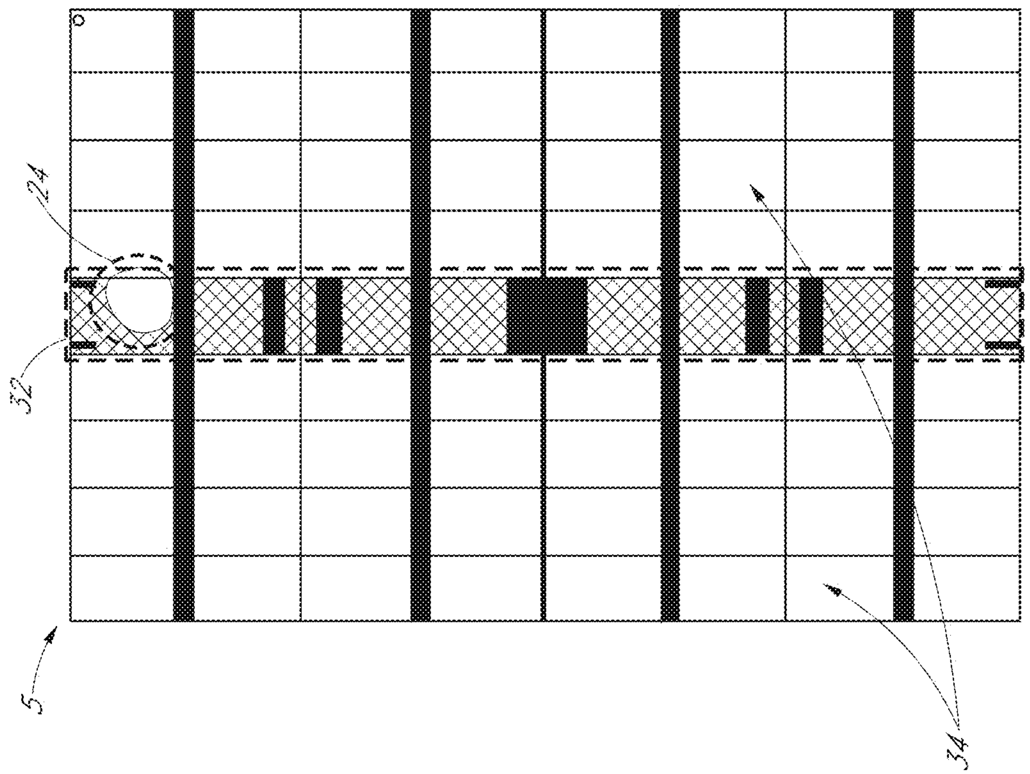
FIG. 2B is a schematic top plan view of another bonded structure showing example locations of faults.
Figure 2A:
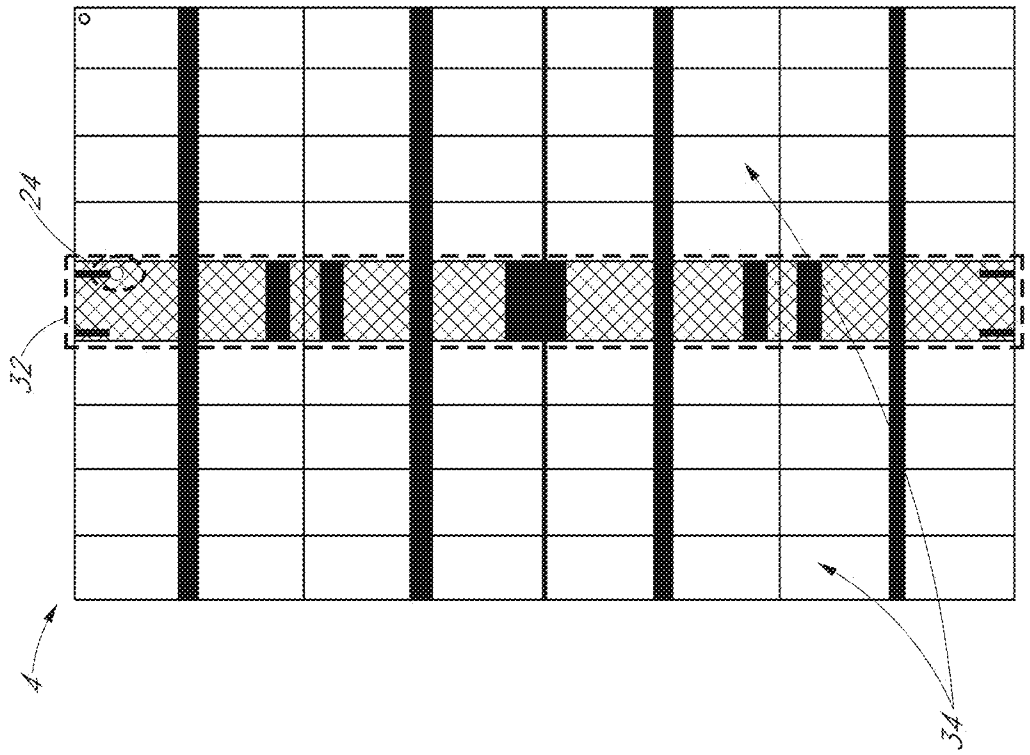
FIG. 2A is a schematic top plan view of a bonded structure showing example locations of faults.

As shown in FIG. 2A, the size of a fault 24 located in the via region 32 may be sufficiently small such that only a few pads may utilize the electrical redundancies disclosed herein. By contrast, in FIG. 2B, the size of the fault 24 may be sufficiently large such that a large number of pads (e.g., a majority or the entirety of pads in a particular zone or region) may utilize the electrical redundancies.

Figure 2D:
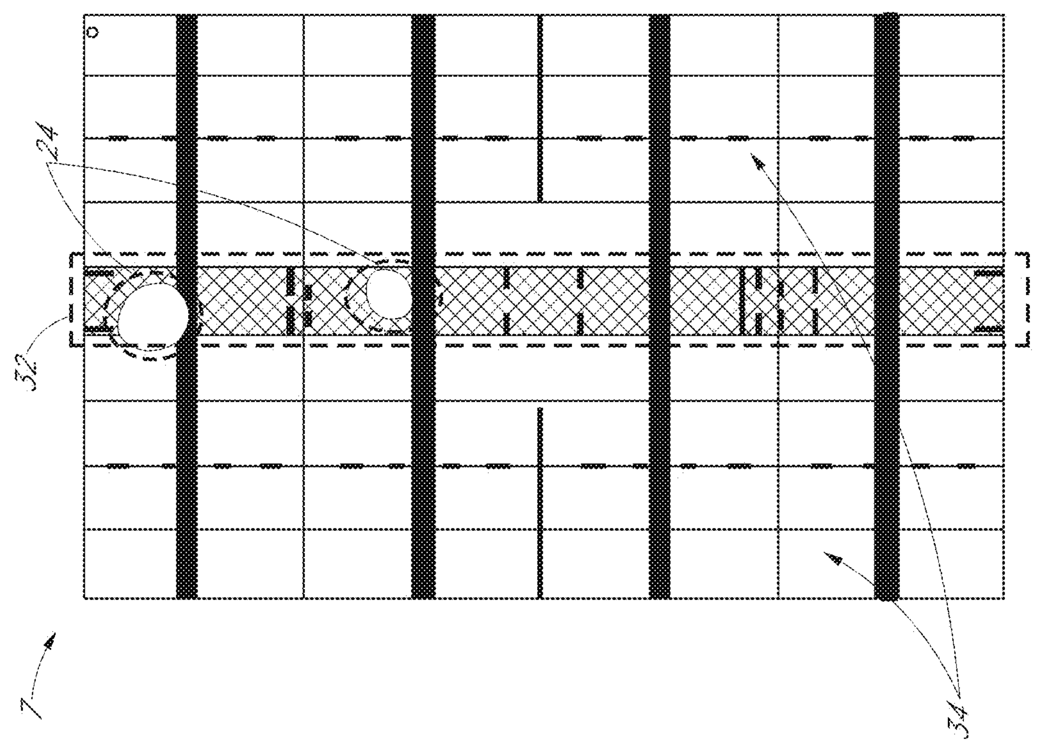
FIG. 2D is a schematic top plan view of another bonded structure showing example locations of faults.
Figure 2C:
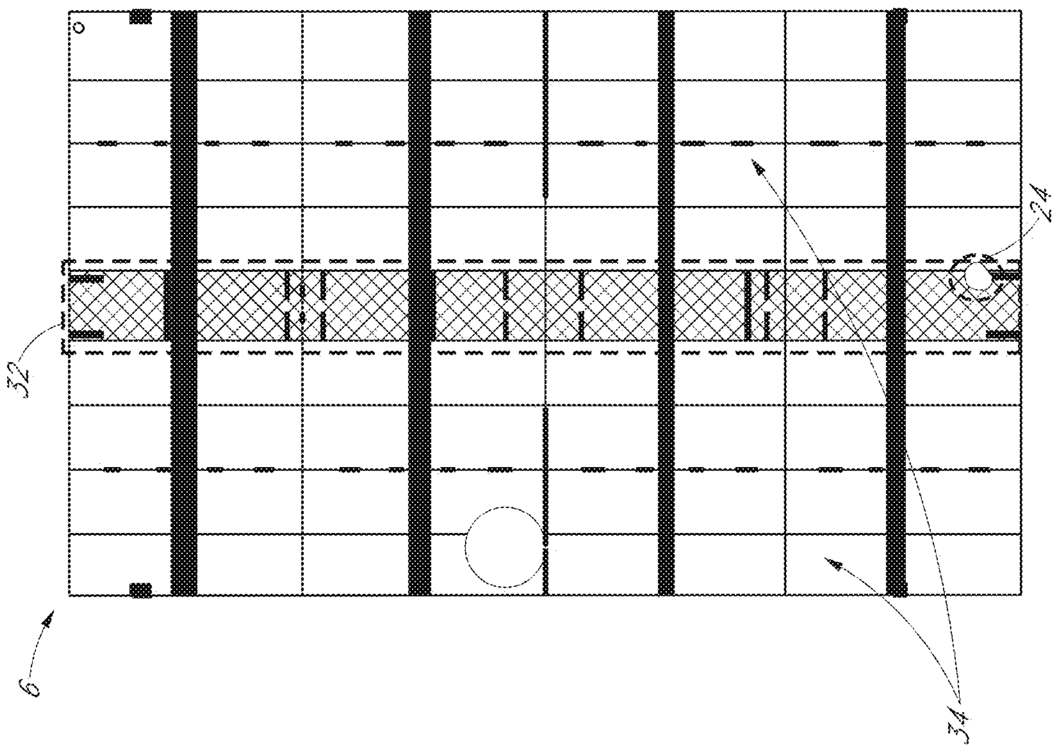
FIG. 2C a schematic top plan view of another bonded structure showing example locations of faults.

FIGS. 2C and 2D illustrate other examples of potential fault 24 locations and sizes that may interfere with electrical connections between directly bonded elements, such as dies. As in FIG. 2A, the size of a fault 24 located in the via region 32 shown in FIG. 2C may be sufficiently small such that only a few pads may utilize the electrical redundancies disclosed herein. By contrast, as in FIG. 2B, the size of the faults 24 may be sufficiently large in FIG. 2D such that a large number of pads (e.g., a majority or the entirety of pads in a particular zone or region) may utilize the electrical redundancies.

Figure 2E:
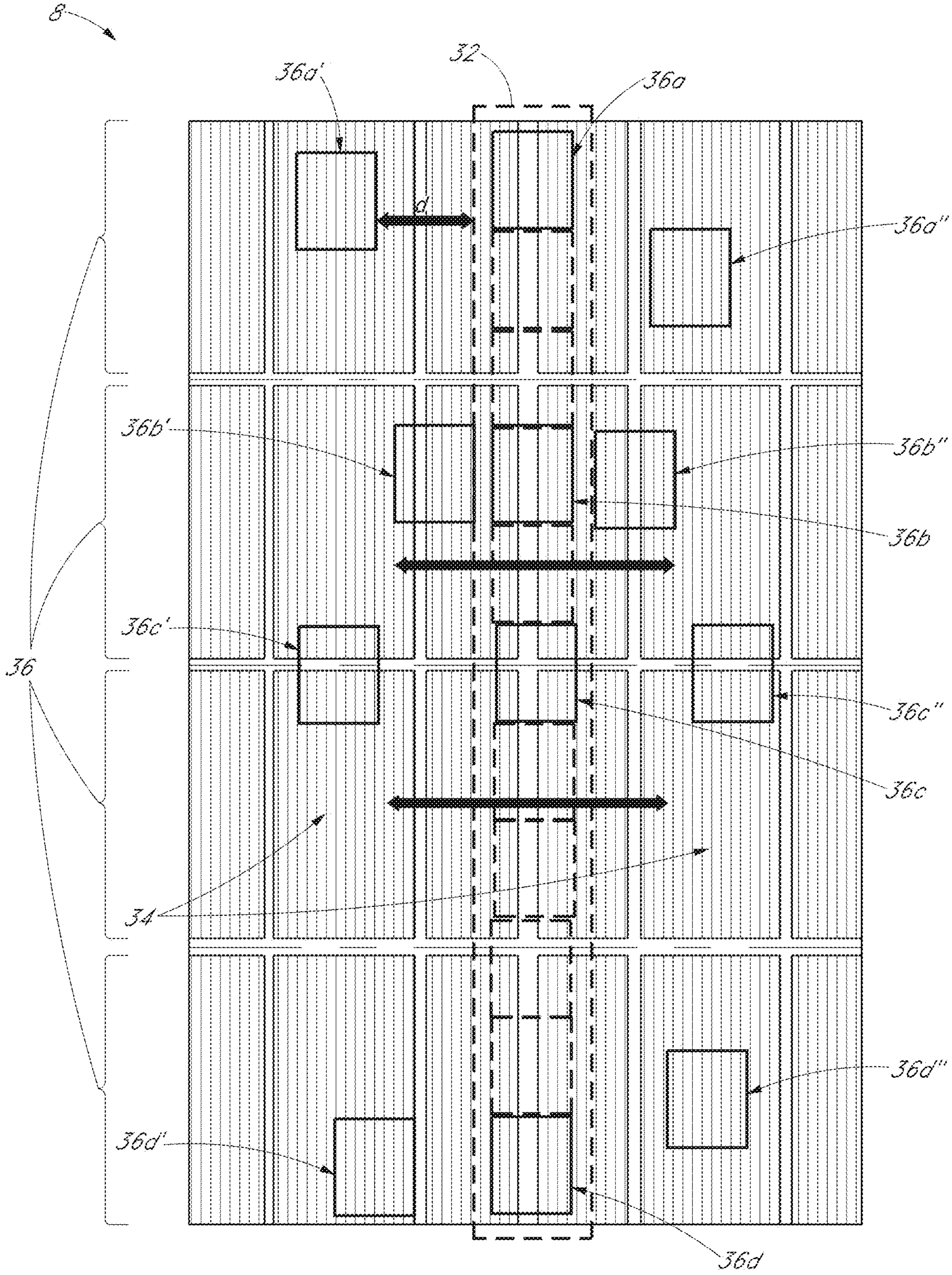
FIG. 2E is a schematic top plan view of another bonded structure having zones for redundant pads to provide back-up connections in the event that bonding generates faults that interfere with some connections in a hybrid bonded structure.

For example as shown in the top view of FIG. 2E, the bonded structure 8 can include a plurality of zones 36 along the conductive via regions 32 in which it may be important to provide electrical redundancy. In some embodiments, one zone of the plurality of zones 36 can include 50-1000 pads, e.g., about 200 to about 500 conductive pads. For example, for a first zone 36*a* of primary contacts, one or more redundant zones 36*a*', 36*a*" in the peripheral regions 34 can include contact pads electrically shorted to corresponding pads in the first zone 36*a*. Similarly, in a second zone 36*b* of primary contacts, one or more redundant zones 36*b*', 36*b*" in the peripheral regions 34 can include contact pads electrically shorted to corresponding pads in the second zone 36*b*. In a third zone 36*c* of primary pads, one or more redundant zones 36*c*', 36*c*" in the peripheral regions 34 can include contact pads electrically shorted to corresponding pads in the third zone 36*c*. In a fourth zone 36*d* of primary pads, one or more redundant zones 36*d*', 36*d*" in the peripheral regions 34 can include contact pads electrically shorted to corresponding pads in the fourth zone 36*d*.

In some embodiments, each of the redundant zones 36*a*', 36*a*", 36*b*', 36*b*", 36*c*', 36*c*", 36*d*', 36*d*" in the peripheral regions 34 can be spaced apart from the conductive via regions 32 by a distance d. In some embodiments, the distance d can be at least 10 microns. For example, the distance d can be in a range of 10 microns to 1000 microns, in a range of 50 microns to 1500 microns, or in a range of 100 microns to 1000 microns. In some embodiments, the distance d can be at least a pitch of the contact pads, or at least twice the pitch of the contact pads. For example, the distance d can be two to 1000 times the pitch, or two to 500 times the pitch. This distance d can be selected based upon experimentation to maximize the changes that no one given fault can interfere with both the primary and the redundant pad pairs.

In various embodiments, redundant pads may be provided only for signal pads, such that the connecting lines comprise signal lines, and may not be provided for power and/or ground pads. In other embodiments, redundant pads may also be provided for power and/or ground pads. Any suitable number of zones may be provided. Each zone can have a plurality of pads. In some embodiments, redundancy can be provided on a per pad basis, such that each pad may include one or more corresponding redundant pads to which it is electrically shorted. Minor logic circuits can decide which zone is to be used. For example, logic circuits can be used to decide which redundant zone is to be used for unconnected pads.

In various embodiments, the first and second contact pads can be shorted within an element (e.g., in the first and/or second elements or dies), and can be separated by greater than 5 times a pitch of the pads. In some embodiments, first and second pads can be shorted in each of the first and second elements (e.g., upper and lower dies). In some embodiments, at least four contact pads can be disposed laterally between the first and second contact pads. In some embodiments, there is a void or delamination (e.g., debonding or lack of bonding) under one of the first and second contact pads. In some embodiments, two or more redundant contact pads can be shorted to at least one through substrate via (TSV). In some embodiments, two or more redundant contact pads can be shorted to two or more TSVs, which can provide the ability to shift signal traffic using redundancies based on openings, hot spots, etc.

Thus, in one embodiment, a bonded structure is disclosed. The bonded structure can include a first element having a first plurality of contact pads at a first surface, the first plurality of contact pads including a first contact pad and a second contact pad spaced apart from one another by at least 10 microns, the first and second contact pads electrically shorted to one another. The bonded structure can include a second element stacked on the first element, the second element having a second plurality of contact pads at a second surface, at least one of the second plurality of contact pads bonded and electrically connected to at least one of the first plurality of contact pads.

In some embodiments, the first and second contact pads can be spaced apart from one another by at least five times a first pitch of the first plurality of contact pads. The first and second contact pads can be spaced apart from one another by a spacing that is in a range of two to 1000 times the first pitch. The first and second contact pads can be spaced apart from one another by a spacing that is in a range of two to 500 times the pitch. The first and second contact pads can be spaced apart by at least 2 microns. The first and second contact pads can be spaced apart by a spacing in a range of 10 microns to 1000 microns. The first and second contact pads can be spaced apart by a spacing in a range of 50 microns to 1500 microns. The first and second contact pads can be spaced apart by a spacing in a range of 100 microns to 1000 microns. The at least one of the first plurality of contact pads can be directly bonded to the at least one of the second plurality of contact pads without an intervening adhesive. The bonded structure can include first and second dielectric field regions on the first and second elements, the first and second dielectric field regions directly bonded to one another without an adhesive. The first contact pad of the first element can be disposed opposite a third contact pad of the second element. The second contact pad of the first element can be disposed opposite a fourth contact pad of the second element. A void can be disposed between at least a portion of the first and third contact pads. The second and fourth contact pads can physically and electrically contact one another. The first and third contact pads may not be directly electrically connected to one another. The first contact pad of the first element can be disposed opposite a third contact pad of the second element. The second contact pad of the first element can be disposed opposite a fourth contact pad of the second element. At least a portion of the first and third contact pads can be located at a bonding fault along a bonding interface between the first and second elements. The second and fourth contact pads can physically and electrically contact one another.

In another embodiment, a bonded structure is disclosed. The bonded structure can include a first element having a first plurality of spaced contact pads having a first pitch at a first surface, the first plurality of contact pads including a first contact pad and a second contact pad of the first plurality spaced apart from one another, the first and second contact pads electrically shorted to one another. The bonded structure can include a second element stacked on the first element, the second element having a second plurality of spaced contact pads at a second surface, at least one of the second plurality of contact pads bonded and electrically connected to at least one of the first plurality of contact pads.

In some embodiments, the first and second contact pads can be spaced apart from one another by at least five times the first pitch. The first and second contact pads can be spaced apart from one another by a spacing that is in a range of two to 1000 times the first pitch. The first and second contact pads can be spaced apart from one another by a spacing that is in a range of two to 500 times the pitch. The first and second contact pads can be spaced apart from one another by at least 10 microns. The first and second contact pads can be spaced apart by a spacing in a range of 10 microns to 1000 microns. The first and second contact pads can be spaced apart by a spacing in a range of 50 microns to 1500 microns. The first and second contact pads can be spaced apart by a spacing in a range of 100 microns to 1000 microns. The at least one of the first plurality of contact pads can be directly bonded to the at least one of the second plurality of contact pads without an intervening adhesive. The bonded structure can include first and second dielectric field regions on the first and second elements, the first and second dielectric field regions directly bonded to one another without an adhesive. The first contact pad of the first element can be disposed opposite a third contact pad of the second element. The second contact pad of the first element can be disposed opposite a fourth contact pad of the second element. A void can be disposed between at least a portion of the first and third contact pads. The second and fourth contact pads can physically and electrically contact one another. The first and third contact pads may not be directly electrically connected to one another. The first contact pad of the first element can be disposed opposite a third contact pad of the second element. The second contact pad of the first element can be disposed opposite a fourth contact pad of the second element. At least a portion of the first and third contact pads can be located at a bonding fault along a bonding interface between the first and second elements. The second and fourth contact pads can physically and electrically contact one another.

In one embodiment, the first contact pad and the second contact pad are spaced apart from one another by at least twice the first pitch.

In one aspect, a first element that is configured to directly bond to a second element without an intervening adhesive is disclosed. The first element can include a first plurality of contact pads that are positioned at a first surface of the first element. The first plurality of contact pads include a first contact pad and a second contact pad that are spaced apart from one another by at least 10 microns. The first plurality of contact pads are prepared for direct bonding. The first element can also include a conductive line that electrically connects the first and second contact pads. The first and second contact pads are electrically connected to one another through the conductive line. The first element can further include a first dielectric field region positioned at the first surface of the first element. The first dielectric field region are disposed at least partially between the first and second contact pads. The first dielectric field region is prepared for direct bonding.

In one embodiment, the first and second contact pads are spaced apart from one another by at least five times a first pitch of the first plurality of contact pads. The first and second contact pads are spaced apart from one another by a spacing that is in a range of two to 1000 times the first pitch.

In one embodiment, the first and second contact pads are spaced apart by a spacing in a range of 10 microns to 1000 microns.

In one embodiment, each of the first plurality of contact pads is prepared to directly bond to each of a second plurality of contact pads of the second element without an intervening adhesive. The first dielectric field region on the first element is prepared to directly bond to a second dielectric field region of the second element without an adhesive.

In one embodiment, the first element further include a circuitry that is coupled to the first contact pad and the second contact pad along the conductive line. The circuitry can be configured to selectively enable shorting the first contact pad to the second contact pad. The circuitry comprises a switch or an electronic fuse.

In one aspect, a bonded structure is disclosed. The bonded structure can include a first element that has a first plurality of contact pads at a first surface. The first plurality of contact pads includes a first contact pad and a second contact pad that are spaced apart from one another. The first and second contact pads are electrically connected to one another. The bonded structure can also include a second element that is stacked on the first element. The second element has a second plurality of contact pads at a second surface corresponding to the first plurality of contact pads of the first element. At least one of the second plurality of contact pads is bonded and electrically connected to at least one of the first plurality of contact pads.

In one embodiment, the first contact pad and the second contact pad are spaced apart from one another according to a first pitch across the first plurality of contact pads.

In one embodiment, the first contact pad and the second contact pad are spaced apart from one another by at least twice the first pitch.

In one embodiment, the first and second contact pads are spaced apart from one another by at least five times the first pitch.

In one embodiment, the first and second contact pads are spaced apart from one another by a spacing that is in a range of two to 1000 times the first pitch.

In one embodiment, the first and second contact pads are spaced apart from one another by a spacing that is in a range of two to 500 times the pitch.

In one embodiment, the first and second contact pads are spaced apart from one another by at least 2 microns.

In one embodiment, the first and second contact pads are spaced apart from one another by at least 10 microns.

The first and second contact pads can be spaced apart by a spacing in a range of 10 microns to 1000 microns.

In one embodiment, the at least one of the first plurality of contact pads is directly bonded to the at least one of the second plurality of contact pads without an intervening adhesive. The bonded structure can further include first and second dielectric field regions on the first and second elements. The first and second dielectric field regions can be directly bonded to one another without an adhesive.

In one embodiment, the first contact pad of the first element is disposed opposite a third contact pad of the second element. The second contact pad of the first element can be disposed opposite a fourth contact pad of the second element. A void can be disposed between at least a portion of the first and third contact pads. The second and fourth contact pads can be physically and electrically contact one another. The first and third contact pads may not directly connected to one another.

In one embodiment, the first contact pad of the first element is disposed opposite a third contact pad of the second element. The second contact pad of the first element can be disposed opposite a fourth contact pad of the second element. At least a portion of the first and third contact pads can be located at a bonding fault along a bonding interface between the first and second elements. The second and fourth contact pads physically and electrically contact one another.

In one embodiment, the first contact pad and the second contact pad are electrically connected to one another by way of circuitry configured to selectively short the first contact pad to the second contact pad.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A bonded structure, comprising:

a first element having a first plurality of metal pads at a first surface, the first plurality of metal pads including a first metal pad and a second metal pad spaced apart from one another, and an intervening metal pad disposed between the first and second metal pads, wherein the first and second metal pads are electrically connected to one another such that the first and second metal pads are electrically redundant, and the intervening metal pad is electrically non-redundant of the first and second metal pads; and a second element stacked on the first element, the second element having a second plurality of metal pads on a second surface, at least one of the second plurality of metal pads bonded and electrically connected to at least one of the first plurality of metal pads.

2. The bonded structure of claim 1, wherein the first and second metal pads are spaced apart from one another by at least five times a pitch of the first plurality of metal pads.

3. The bonded structure of claim 1, wherein the first and second metal pads are spaced apart from one another by a spacing that is in a range of two to 1000 times a pitch of the first plurality of metal pads.

4. The bonded structure of claim 1, wherein the first and second metal pads are spaced apart from one another by a spacing that is in a range of two to 500 times a pitch of the first plurality of metal pads.

5. The bonded structure of claim 1, wherein the at least one of the first plurality of metal pads is directly bonded to the at least one of the second plurality of metal pads without an intervening adhesive.

6. The bonded structure of claim 5, further comprising first and second dielectric field regions on the first and second elements, the first and second dielectric field regions directly bonded to one another without an adhesive.

7. The bonded structure of claim 1, wherein the first metal pad of the first element is disposed opposite a third metal pad of the second element, wherein the second metal pad of the first element is disposed opposite a fourth metal pad of the second element, wherein a void is disposed between at least a portion of the first and third metal pads, and wherein the second and fourth metal pads physically and electrically metal one another.

8. The bonded structure of claim 1, wherein the first metal pad and the second metal pad are spaced apart from one another by at least twice a pitch of the first plurality of metal pads.

9. The bonded structure of claim 1, wherein the first and second metal pads are electrically connected to one another through a conductive trace.

10. The bonded structure of claim 9, wherein the conductive trace is formed in a back-end-of line (BEOL) layer.

11. The bonded structure of claim 9, wherein the conductive trace lacks switches and other circuitry between the first and second metal pads.

12. The bonded structure of claim 1, wherein the first and second metal pads are signal pads.

13. The bonded structure of claim 1, wherein the first and second metal pads are spaced apart from one another by at least 14 microns.

14. The bonded structure of claim 1, wherein the first and second metal pads are spaced apart from one another by a spacing in a range of 1 micron to 10 microns.

15. The bonded structure of claim 1, wherein the first and second metal pads are spaced apart from one another by a spacing in a range of 2 microns to 100 microns.

16. The bonded structure of claim 15, wherein the first and second metal pads are spaced apart from one another by a spacing in a range of 50 microns to 100 microns.

17. The bonded structure of claim 1, further comprising a plurality of pads disposed between the first and second metal pads, the plurality of pads comprising the intervening metal pad.

18. A bonded structure, comprising:

a first element having a first dielectric field region and a first set of metal pads spaced apart from one another, the first set of metal pads including a first metal pad, a second metal pad, and a third metal pad positioned between the first and second metal pads, the second metal pad being electrically redundant with the first metal pad, the third metal pad being electrically non-redundant with the first metal pad; and a second element stacked on the first element, the second element having a second dielectric field region directly bonded to the first dielectric field region and a second set of metal pads spaced apart from one another, at least one of the second set of metal pads directly bonded and electrically connected to at least one of the first set of metal pads.

19. The bonded structure of claim 18, wherein the first and second metal pads are spaced apart by at least 10 microns.

20. The bonded structure of claim 19, wherein the first and second metal pads are spaced apart by 50 microns to 1500 microns.

21. The bonded structure of claim 18, wherein the first and second metal pads are signal pads.

22. The bonded structure of claim 18, wherein the first and second metal pads are power or ground pads.

23. The bonded structure of claim 18, further comprising a circuit coupled between the first metal pad and the second metal pad, the circuit configured to selectively enable electrical shorting the first metal pad to the second metal pad.

24. A bonded structure, comprising:

a first element having a first surface comprising a first plurality of metal pads and a first nonconductive field region, wherein a shortest distance in a cross-sectional view between two adjacent metal pads of the first plurality of metal pads defines a first spacing; and a second element having a second surface comprising a second plurality of metal pads and a second nonconductive field region, the first nonconductive field region being directly bonded to the second nonconductive field region and at least some of the first plurality of metal pads being directly bonded to metal pads of the second plurality of metal pads, wherein a third plurality of metal pads is defined by metal pads of the first plurality of metal pads that are electrically shorted to one another, and wherein a metal pad of the third plurality of metal pads is separated from its nearest adjacent metal pad in the third plurality of metal pads by a second spacing in the cross-sectional view, the second spacing being greater than the first spacing.

25. The bonded structure of claim 24, wherein the first plurality of metal pads and the second plurality of metal pads comprise signal metal pads.

26. The bonded structure of claim 25 wherein the second spacing is in a range between 10 μm and 1000 μm.

27. The bonded structure of claim 25, wherein:

the third plurality of metal pads include a first pad and a second pad electrically shorted to one another within the first element;

the second plurality of metal pads include a third metal pad and a fourth metal pad electrically shorted to one another within the second element; and the first and second metal pads are directly bonded to the third and fourth metal pads.

28. The bonded structure of claim 24, wherein the second spacing is in a range between 2 μm and 100 μm.

29. The bonded structure of claim 24, wherein the second spacing is greater than twice a minimum pitch among the first plurality of metal pads.

30. The bonded structure of claim 24, wherein the third plurality of metal pads are electrically shorted by at least one conductive line of the first element without intervening switches.

31. The bonded structure of claim 24, wherein at least one of the first element and the second element comprises an integrated circuit.

* * * * *